United States Patent
Ma et al.

(10) Patent No.: US 11,991,906 B2
(45) Date of Patent: May 21, 2024

(54) DISPLAY SUBSTRATE AND MANUFACTURING METHOD THEREOF, DISPLAY DEVICE

(71) Applicants: Beijing BOE Technology Development Co., Ltd., Beijing (CN); BOE TECHNOLOGY GROUP CO., LTD., Beijing (CN)

(72) Inventors: Yongda Ma, Beijing (CN); Xueguang Hao, Beijing (CN); Yong Qiao, Beijing (CN); Xinyin Wu, Beijing (CN)

(73) Assignees: Beijing BOE Technology Development Co., Ltd., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 600 days.

(21) Appl. No.: 17/276,282

(22) PCT Filed: Jul. 31, 2020

(86) PCT No.: PCT/CN2020/106204
§ 371 (c)(1),
(2) Date: Mar. 15, 2021

(87) PCT Pub. No.: WO2021/023107
PCT Pub. Date: Feb. 11, 2021

(65) Prior Publication Data
US 2022/0037448 A1   Feb. 3, 2022

(30) Foreign Application Priority Data
Aug. 5, 2019 (CN) .......................... 201921258054.2

(51) Int. Cl.
*H10K 59/131* (2023.01)
*G09G 3/3275* (2016.01)
*H10K 59/12* (2023.01)

(52) U.S. Cl.
CPC .......... *H10K 59/131* (2023.02); *G09G 3/3275* (2013.01); *G09G 2300/0876* (2013.01); *H10K 59/1201* (2023.02)

(58) Field of Classification Search
CPC ............. H10K 59/131; H10K 59/1213; H10K 59/1216
See application file for complete search history.

(56) References Cited

U.S. PATENT DOCUMENTS

2004/0004432 A1* 1/2004 Park ................... H10K 59/1275
                                                              313/504
2004/0135496 A1* 7/2004 Park .................... H10K 59/127
                                                              313/504

(Continued)

FOREIGN PATENT DOCUMENTS

| CN | 101800195 A | 8/2010 |
| CN | 104733499 A | 6/2015 |

(Continued)

OTHER PUBLICATIONS

European Patent Office, Extended European search report, dated Sep. 9, 2022, application No. EP20850140.3.

*Primary Examiner* — Erik Kielin
(74) *Attorney, Agent, or Firm* — HOUTTEMAN LAW LLC

(57) ABSTRACT

The present disclosure provides a display substrate and a manufacturing method thereof, and a display device. The display substrate includes a plurality of pixel regions, each of the pixel regions including a display region provided with a pixel electrode and a driving region provided with a pixel circuit. The pixel circuit includes at least one pixel transistor having a first electrode and a second electrode which are coupled to an active layer of the at least one pixel transistor through connection vias, respectively. The driving region is further provided with a first plate of a storage capacitor, the (Continued)

first plate is insulated from and overlapped with the first electrode and the second electrode of the pixel transistor in a direction perpendicular to the display substrate, and the first plate is provided with openings at positions corresponding to at least some of the connection vias.

20 Claims, 5 Drawing Sheets

(56) References Cited

U.S. PATENT DOCUMENTS

| | | |
|---|---|---|
| 2010/0201658 A1 | 8/2010 | Koshiishi et al. |
| 2014/0054562 A1* | 2/2014 | Lee .................... H10K 59/131 |
| | | 257/66 |
| 2014/0299843 A1 | 10/2014 | Kim |
| 2019/0229172 A1 | 7/2019 | Liu et al. |
| 2019/0237494 A1 | 8/2019 | Bae et al. |

FOREIGN PATENT DOCUMENTS

| | | |
|---|---|---|
| CN | 107680993 A | 2/2018 |
| CN | 107785404 A | 3/2018 |
| CN | 209912874 U | 1/2020 |
| EP | 2214207 A2 | 8/2010 |

\* cited by examiner

DISPLAY SUBSTRATE AND MANUFACTURING METHOD THEREOF, DISPLAY DEVICE

CROSS-REFERENCE TO RELATED APPLICATIONS

The present disclosure claims the priority of the Chinese Patent Application No. 201921258054.2, filed on Aug. 5, 2019 in the Chinese Intellectual Property Office, the content of which is incorporated herein by reference in its entirety.

TECHNICAL FIELD

The present disclosure relates to the technical field of display technology, and particularly, to a display substrate and a manufacturing method thereof, and a display device.

BACKGROUND

In a current display substrate (e.g., an organic light emitting diode display substrate), an area of a pixel region is gradually reduced as a resolution is gradually improved. In order to increase storage capacitance, an area of a plate of a storage capacitor needs to be increased, which may cause overlapping of the plate with a pixel transistor in a pixel circuit.

SUMMARY

In an aspect, a display substrate is provided. The display substrate includes a plurality of pixel regions, each of the pixel regions including a display region with a light emitting device and a driving region with a pixel circuit, the pixel circuit including at least one pixel transistor having a first electrode and a second electrode which are coupled to an active layer of the at least one pixel transistor through connection vias, respectively, wherein the driving region is further provided with a first plate of a storage capacitor, the first plate is insulated from and overlapped with the first electrode and the second electrode of the at least one pixel transistor in a direction perpendicular to the display substrate, and the first plate is provided with openings at positions corresponding to at least some of the connection vias.

Optionally, in one of the pixel regions, the first plate is coupled to a first electrode of a light emitting element, and a second electrode of the light emitting element is coupled to a second power supply line; the at least one pixel transistor includes a switching transistor and a driving transistor; wherein a gate of the switching transistor is coupled to a gate line, a first electrode of the switching transistor is coupled to a data line, and a second electrode of the switching transistor is electrically coupled to a gate of the driving transistor; and a first electrode of the driving transistor is coupled to a first power line, and a second electrode of the driving transistor is coupled to a pixel electrode.

Optionally, the first plate has the opening at at least one of positions corresponding to following connection vias: a connection via of the first electrode of the switching transistor; a connection via of the second electrode of the switching transistor; and a connection via of the first electrode of the driving transistor.

Optionally, the first plate is insulated from and overlapped with the connection via of the second electrode of the driving transistor in the direction perpendicular to the display substrate, and the first plate has the opening at a position corresponding to the connection via corresponding to the second electrode of the driving transistor.

Optionally, the first plate is insulated from and overlapped with the connection via of the second electrode of the driving transistor in the direction perpendicular to the display substrate, and the first plate does not have the opening at a position corresponding to the connection via corresponding to the second electrode of the driving transistor.

Optionally, the storage capacitor further includes: a second plate electrically coupled to the second electrode of the switching transistor, wherein the second plate is insulated from and overlapped with the first plate in the direction perpendicular to the display substrate to form a first sub-capacitor.

Optionally, the second plate is in a same layer as the active layer of the pixel transistor.

Optionally, the storage capacitor further includes: a third plate electrically coupled to the first plate, wherein the third plate is in a same layer with the first electrode and the second electrode of the pixel transistor, and is insulated from and overlapped with the second plate to form a second sub-capacitor.

Optionally, the light emitting element is an organic light emitting diode.

Optionally, the display substrate further includes a base substrate, wherein the first electrode and the second electrode of the pixel transistor are on a side of the active layer of the pixel transistor distal to the base substrate; and the first plate is on a side of the active layer of the pixel transistor proximal to the bade substrate.

Optionally, an orthographic projection of the opening on the base substrate covers an orthographic projection of the corresponding connection via on the base substrate.

Optionally, the orthographic projection of the opening on the base substrate has an area larger than or equal to an area of the orthographic projection of the corresponding connection via on the base substrate.

Optionally, a slope angle of the connection via corresponding to the opening is an acute angle, and the slope angle is an included angle between a side wall of the connection via and a plane where the display substrate is located.

Optionally, the slope angle of the connection via corresponding to the opening is in a range from 45 degrees to 75 degrees.

Optionally, a boundary angle of the active layer at the connection via corresponding to the opening is an acute angle, and the boundary angle is an included angle between a side wall of the active layer and a plane where the display substrate is located.

Optionally, a slope angle of the connection via corresponding to the opening is an acute angle; and $(\alpha+\beta)/2 > \min(\alpha, \beta) > \frac{1}{4}\alpha$, wherein $\alpha$ is a slope angle of any connection via corresponding to the opening, $\beta$ is a boundary angle of the active layer at the connection via, the slope angle is a included angle between a side wall of the connection via and a plane where the display substrate is located, and the boundary angle is a included angle between a side wall of the active layer and the plane where the display substrate is located.

Optionally, the opening includes: a notch at an edge of the first plate; and/or a through hole within the first plate.

In another aspect, a display device including the above display substrate is provided.

In another aspect, a method for manufacturing a display substrate is provided, including: providing a base substrate;

forming a storage capacitor and at least one pixel transistor on the base substrate, wherein the display substrate includes a plurality of pixel regions, each of the pixel regions includes a display region provided with a pixel electrode and a driving region provided with a pixel circuit, the pixel circuit includes at least one pixel transistor having a first electrode and a second electrode which are coupled to an active layer of the at least one pixel transistor through connection vias, respectively, wherein a first plate of the storage capacitor is located in the driving region, the first plate is insulated from and overlapped with the first electrode and the second electrode of the pixel transistor in a direction perpendicular to the display substrate, and the first plate is provided with openings at positions corresponding to at least some of the connection vias.

Optionally, forming a storage capacitor and at least one pixel transistor on the base substrate includes: forming the first plate of the storage capacitor on the base substrate; forming a first insulating layer on the first plate; forming a gate of a switching transistor and a gate line on the first insulating layer; forming a second insulating layer on the gate of the switching transistor and the gate line; forming an active layer of the switching transistor, an active layer of a driving transistor and a second plate of the storage capacitor on the second insulating layer, wherein the second plate is insulated from and overlapped with the first plate in a direction perpendicular to the base substrate to form a first sub-capacitor; forming a third insulating layer on the active layer of the switching transistor, the active layer of the driving transistor, and the second plate of the storage capacitor; and forming a first electrode of the switching transistor, a second electrode of the switching transistor, a first electrode of the driving transistor, a second electrode of the driving transistor, a gate of the driving transistor, a data line, a first power supply line and a third plate on the third insulating layer, wherein the third plate is coupled to the first plate through the connection via and is coupled to the second electrode of the driving transistor, and the second plate is insulated from and overlapped with the third plate in the direction perpendicular to the base substrate to form a second sub-capacitor.

DETAILED DESCRIPTION

Figure 1:
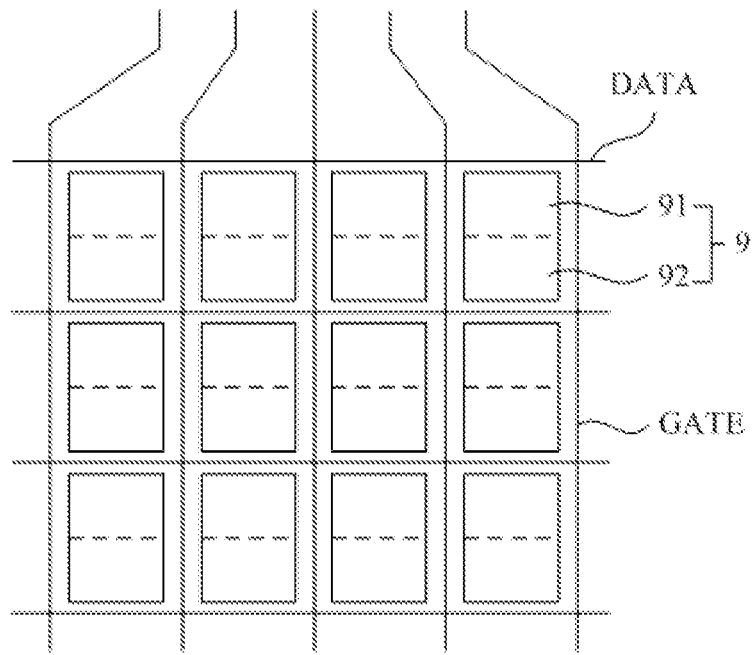
FIG. 1 is a schematic diagram of a structure of a display substrate according to an embodiment of the present disclosure.
Figure 2:
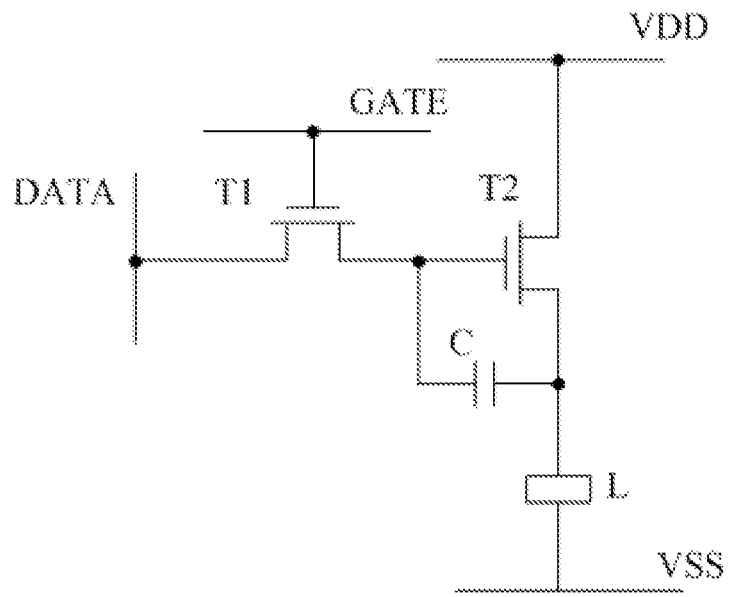
FIG. 2 is a circuit diagram of a pixel circuit in a display substrate according to an embodiment of the present disclosure.

In order to make one of ordinary skill in the art understand the technical solutions of the present disclosure better, the present disclosure is described below in detail with reference to the accompanying drawings and the specific embodiments.

It should be understood that, the specific embodiments and the accompanying drawings described herein are merely used to explain the present disclosure and are not intended to limit the present disclosure.

It should be understood that, the embodiments and features of the embodiments in the present disclosure may be combined with each other without conflict.

It should be understood that, for convenience of description, only portions related to the present disclosure are shown in the accompanying drawings of the present disclosure, and portions not related to the present disclosure are not shown in the accompanying drawings.

It should be understood that, each of units and modules referred to in the embodiments of the present disclosure may correspond to only one physical structure, and may also be composed of multiple physical structures, or multiple units and multiple modules may also be integrated into one physical structure.

Noun Explanation

In the present disclosure, the following technical terms should be understood according to the following explanations, unless otherwise specified.

Multiple structures being "in a same layer" means that the multiple structures are formed from a same layer of material, and thus the multiple structures are in a same layer in stacking relationship, which does not mean that the multiple structures have a same distance from the base substrate nor that the other layers structures between the multiple structures and the base substrate are identical. In contrast, the structures being "in different layers" means that the multiple structures are formed from different material layers, which does not meet the above condition of "in a same layer".

"Patterning process" refers to steps of forming a structure having a specific pattern, which may be a photolithography process. The photolithography process includes one or more steps of forming a material layer, coating photoresist, exposing, developing, etching, stripping photoresist, or the like. Of course, the patterning process may be other processes, such as, an imprinting process, an inkjet printing, or the like.

"Opening" means that a first plate originally has a relatively complete regular shape (such as a rectangle), and has deletions (such as notches or holes) at some positions, so that the positions where the regular shape is not complete are the "openings".

Since a first electrode and a second electrode (i.e., a source and a drain) of a pixel transistor are generally coupled to an active layer thereof through connection vias, and most of the first and second electrodes have voltages different from voltages of electrodes of a storage capacitor, a voltage difference exists between overlapping layers of the pixel transistor and the storage capacitor. Therefore, at the position where the connection vias are located, a short circuit failure easily occurs between the storage capacitor and the pixel transistor (specifically, between the electrodes of the storage capacitor and the first and second electrodes of the pixel transistor), and the product quality is reduced.

Therefore, according to an aspect of the present disclosure, a display substrate is provided. The display substrate includes a plurality of pixel regions. Each of the pixel regions includes a display region provided with a pixel electrode and a driving region provided with a pixel circuit. The pixel circuit includes at least one pixel transistor, and a first electrode and a second electrode of the pixel transistor are respectively coupled to an active layer of the pixel transistor through connection vias. The driving region is also provided with a first plate of the storage capacitor. The first plate is insulated from and overlapped with the first electrode and the second electrode of the pixel transistor in a direction perpendicular to the display substrate, and is provided with openings at positions corresponding to at least some of the connecting vias of at least some of the pixel transistors.

In the display substrate of the embodiment of the present disclosure, the storage capacitor is located in the driving region and overlaps with the pixel transistor, so that the storage capacitor has a larger area and the storage effect is good. Meanwhile, the first plate of the storage capacitor is provided with openings at positions corresponding to the connection vias, that is, there is no or a little overlapping between the first plate and the connection vias, so that the risk that a failure such as short circuit in the first plate occurs at the connection vias is reduced, and the product quality is improved.

The display substrate of the present disclosure is described in detail with reference to FIGS. 1 to 8.

The display substrate of the embodiments of the present disclosure includes a plurality of pixel regions 9, and each of the pixel regions 9 includes a display region 92 provided with a pixel electrode 921 and a driving region 91 provided with a pixel circuit. The pixel circuit includes at least one pixel transistor, and the first and second electrodes of the pixel transistor are coupled to an active layer of the pixel transistor through connection vias 2, respectively.

The display substrate of the embodiments of the present disclosure includes the plurality of pixel regions 9, and each of the pixel regions 9 is a minimum unit capable of performing display independently, that is, each of the pixel regions 9 is a sub-pixel. Referring to FIG. 1, the display substrate may further include a plurality of gate lines GATE and a plurality of data lines DATA. The gate lines GATE and the data lines DATA are insulated from each other and cross over each other. Each of the pixel regions 9 is a region surrounded by two adjacent gate lines GATE and two adjacent data lines DATA. Each of the pixel regions 9 may be located in an active region (AA region) of the display substrate. The display substrate may further include a fan-out region (Fanout region, i.e., a top region of FIG. 1) for leading out a lead, etc., which will not be described in detail herein.

In the display substrate, a first power line VDD and a second power line VSS for supplying power to each of the pixel regions 9 may be further included. However, in FIG. 1, the first power line VDD and the second power line VSS are not shown in order to clearly show the relationship among the pixel region 9 and the gate line GATE and the data line DATA.

Figure 3:
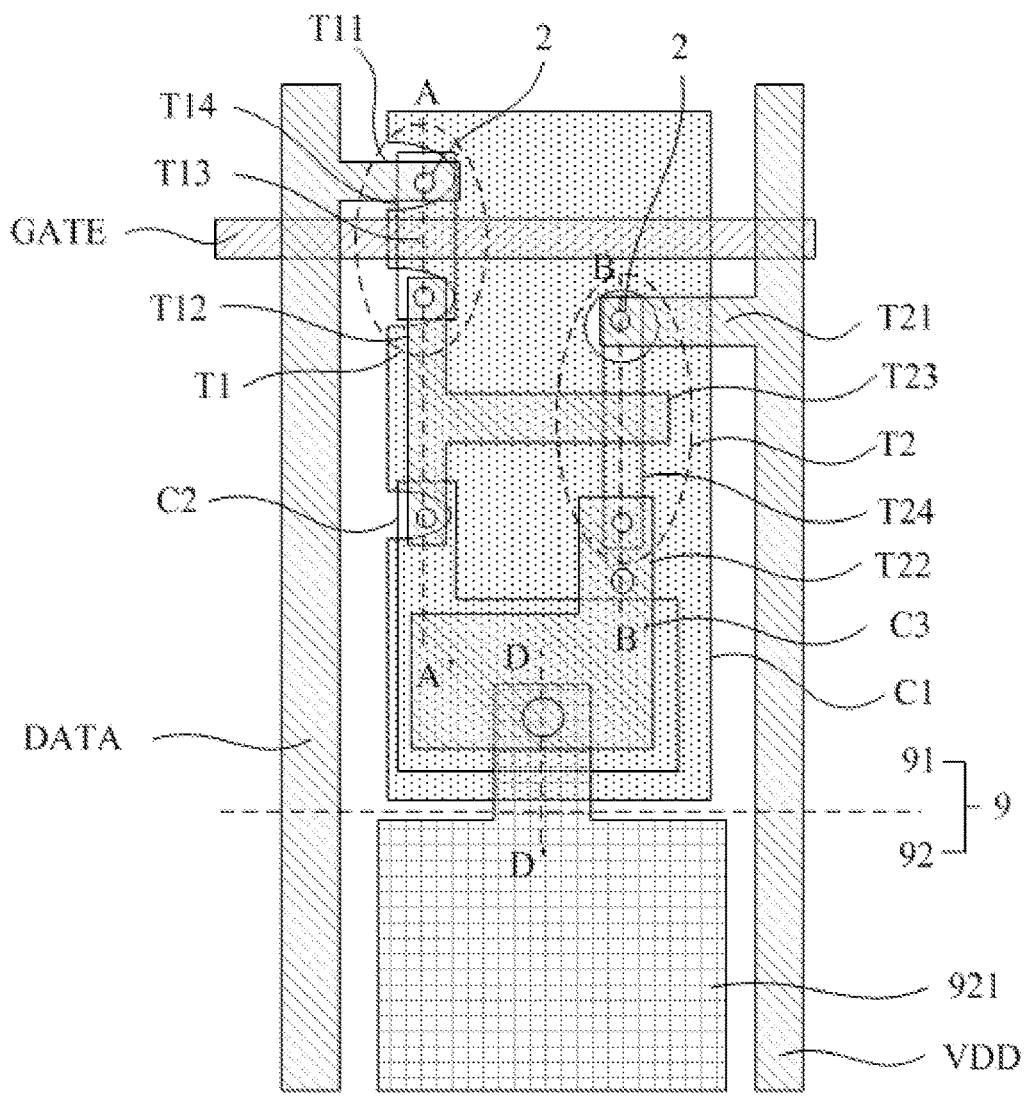
FIG. 3 is a schematic diagram illustrating a structure of a pixel region in a display substrate according to an embodiment of the present disclosure.
Figure 4:
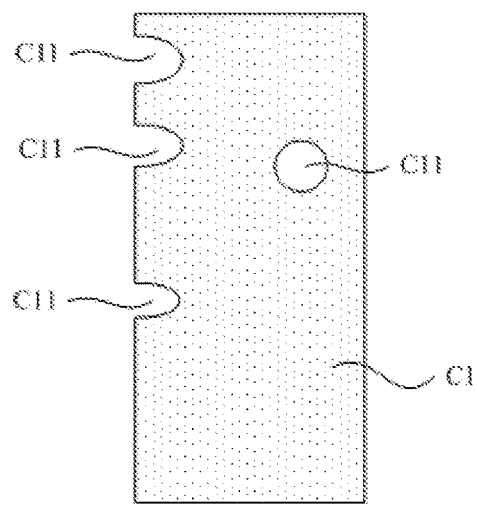
FIG. 4 is a schematic diagram of a structure of a first plate in FIG. 3.

Referring to FIGS. 1 and 3, each of the pixel regions 9 includes the display region 92 and the driving region 91. The display region 92 is provided with the pixel electrode 921, and the display region 92 may display desired contents by driving the pixel electrode 921 with a data voltage (a gray-scale voltage). The driving region 91 is provided with the pixel circuit for driving the display region 92 to display.

The pixel circuit includes at least one transistor (pixel transistor) whose source and drain (i.e. first and second electrodes) are coupled to its corresponding active layer through vias (connection vias 2).

In the drive region 91, there is further provided a first plate C1 of a storage capacitor C. The first plate C1 are insulated from and overlapped with the first and the second electrodes of the pixel transistor in a direction perpendicular to the display substrate, and is provided with openings C11 at positions corresponding to at least some of the connecting vias 2 of at least some of the pixel transistors.

That is to say, the pixel region 9 is further provided with the storage capacitor C, and one plate (the first plate C1) of the storage capacitor C is at least partially located in the driving region 91 and overlaps with the first and the second electrodes of the pixel transistor, so that the first plate C1 has a larger area, and the storage performance of the storage capacitor C may be improved. In one example, as shown in FIG. 3, the first plate C1 covers the entire drive region 91.

Meanwhile, at the connection vias 2 corresponding to at least some of the first and the second electrodes, the first plate C1 has the openings C11, so that there is no or a little overlapping between the first plate C1 and the connection vias 2, thereby reducing the probability that a short circuit in the first plate C1 occurs at the connection vias 2 and improving the product quality.

Optionally, the display substrate further includes a base substrate 5. An orthographic projection of the opening C11 on the base substrate 5 covers an orthographic projection of the connection via 2 corresponding to the opening C11 on the base substrate 5. Further, the orthographic projection of the opening C11 on the base substrate 5 has a larger area than that of the corresponding connection via 2 on the base substrate 5, and further the orthographic projection of the opening C11 on the base substrate 5 has a larger area than a contact area of the data line or the power line and the like with the active layer in the connection via 2.

Figure 5:
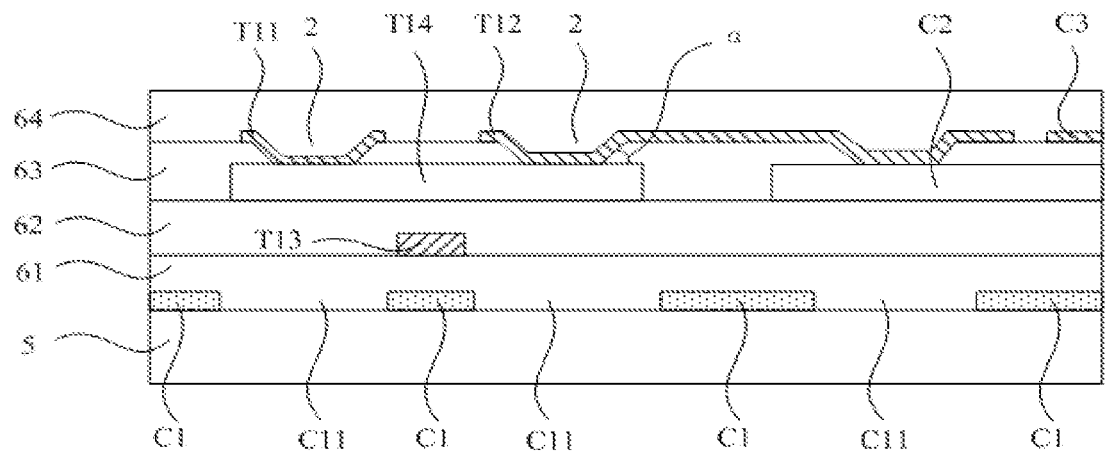
FIG. 5 is a schematic cross-sectional view along a line AA' in FIG. 3.
Figure 6:
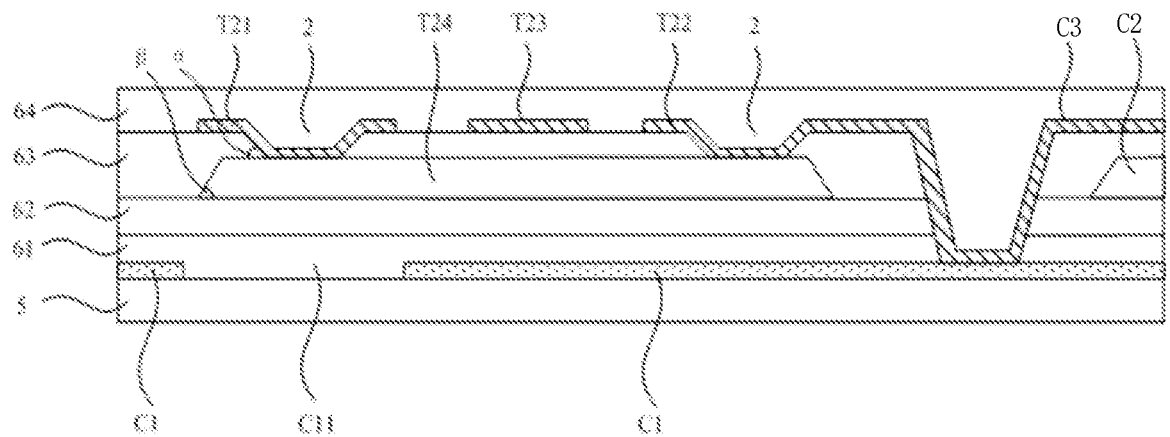
FIG. 6 is a schematic cross-sectional view along a line BB' in FIG. 3.

Referring to FIGS. 3, 5 and 6, preferably, an orthographic projection of the opening C11 on the base substrate 5 completely covers an orthographic projection of the connection via 2 corresponding to the opening C11 on the base substrate 5, thereby ensuring that the first plate C1 does not overlap with the connection vias 2 at all. Further, more preferably, an orthographic projection of the opening C11 on the base substrate 5 completely covers, with a margin, an orthographic projection of the connection via 2 corresponding to the opening C11 on the base substrate 5, so as to avoid short circuit better.

Optionally, the openings C11 include: notches located at an edge of the first plate C1; and/or a through hole located within the first plate C1.

Specific forms of the openings C11 are different according to the positions. When the opening C11 is located at the edge of the first plate C1, the opening C11 is a notch recessed inwards (e.g. three openings C11 on the left side in FIG. 4) from the edge of the first plate C1. When the opening C11 is located within the first plate C1, it is a through hole penetrating through the first plate C1 (the opening C11 proximal to the right side in FIG. 4).

Optionally, a slope angle $\alpha$ of the connection via 2 corresponding to the opening C11 is an acute angle. Further, the slope angle $\alpha$ of the connection via 2 corresponding to the opening C11 is in a range from 45 degrees to 75 degrees.

Referring to FIG. 5, the slope angle $\alpha$ of the connection via 2 is an included angle between a sidewall of the connection via and a plane where the base substrate 5 is located. The slope angle $\alpha$ of the connection via 2 corresponding to at least the opening C11 is an acute angle, and further the slope angle α is in a range from 45 degrees to 75 degrees.

The slope angle α of the via is related to process parameters when the via is formed. When the slope angle α of the via is large, over-etching is more likely to be caused, and thus a wire contact layer is more likely to be formed at the via, increasing the possibility that short circuit between different conductive layers occurs at the via.

Therefore, it has been found through research that the use of the acute slope angle α at the connection via 2 may further reduce the probability of short circuit at the connection via 2.

Optionally, the first and the second electrodes of the pixel transistor are located in the same layer, and are located on a side of the active layer of the pixel transistor distal to the base substrate 5. The first plate C1 is on a side of the active layer of the pixel transistor proximal to the base substrate 5.

That is to say, referring to FIGS. 5 and 6, the first and second electrodes of the pixel transistor may be located above the active layer, so that they are coupled to the active layer through the connection vias 2 below the first and second electrodes. Meanwhile, the first plate C1 is located below the active layer. In this case, the first plate C1 and the connection via 2 are more likely to be short-circuited, so that the opening C11 of the embodiment of the present disclosure is more suitable to be adopted.

According to one implementation of the embodiments of the present disclosure, the first plate C1 is electrically coupled to the pixel electrode 921. The pixel electrode 921 is a first electrode of a light emitting element L, and a second electrode of the light emitting element L is coupled to the second power line VSS. The pixel transistor includes a switching transistor T1 and a driving transistor T2. A gate T13 of the switching transistor is coupled to the gate line GATE, a first electrode T11 of the switching transistor is coupled to the data line DATA, and the second electrode T12 of the switching transistor is electrically coupled to a gate T23 of the driving transistor. The driving transistor has a first electrode T21 coupled to the first power line VDD, and a second electrode coupled to the pixel electrode 921.

Optionally, the light emitting element L is an organic light emitting diode.

That is to say, referring to FIG. 3, the pixel circuit may be implemented specifically in a form of controlling a writing of the data voltage by the switching transistor T1 and controlling a light emitting brightness of the light emitting element L by controlling the voltage of the gate T23 of the driving transistor. In this case, the light emitting element L may be an organic light emitting diode (OLED), and the first electrode (the pixel electrode 921) thereof may be one of a cathode and an anode, and a second electrode thereof is the other one of the cathode and the anode.

It should be appreciated that, FIG. 3 shows the most basic form of the above pixel circuit (2T1C), i.e., each pixel circuit includes at least two pixel transistors (one switching transistor T1 and one driving transistor T2), and one storage capacitor C. However, it is also feasible that other pixel transistors are also included in the pixel circuit.

According to the above pixel circuit, one of the two electrodes of the storage capacitor should be electrically coupled to the pixel electrode 921 (or the second electrode T22 of the driving transistor), and the other of the two electrodes of the storage capacitor should be electrically coupled to the second electrode T12 of the switching transistor (or the gate T23 of the driving transistor). In this case, the first plate C1 of the storage capacitor C is a plate electrically coupled to the pixel electrode 921.

Optionally, the first plate C1 has the opening C11 at the positions corresponding to at least one of the following connection vias 2: the connection via 2 of the first electrode T11 of the switching transistor; the connection via 2 of the second electrode T12 of the switching transistor; and the connection via 2 of the first electrode T21 of the driving transistor.

It can be seen that, since the first plate C1 is not directly coupled to the first electrode T11 and the second electrode T12 of the switching transistor, and is not directly coupled to the first electrode T21 of the driving transistor, the voltages of the three electrodes T11, T12, and T21 are usually different from the voltage of the first plate C1, and a short circuit is more likely to occur between the first plate C1 and the three electrodes T11, T12, and T21. Therefore, referring to FIG. 3, the first plate C1 is preferably provided with the openings C11 at the connection via(s) 2 corresponding to any of the three electrodes T11, T12 and T21 (of course, more preferably, the openings C11 are provided at three connection vias 2 corresponding to each of the three electrodes T11, T12 and T21).

Optionally, as an implementation of an embodiment of the present disclosure, the first plate C1 are insulated from and overlapped with the connection via 2 of the second electrode T22 of the driving transistor.

Since the first plate C1 is electrically coupled to the pixel electrode 921, the first plate C1 is also electrically coupled to the second electrode T22 of the driving transistor. The voltage of the first plate C1 should be theoretically the same as that of the second electrode T22 of the driving transistor at any time, so that the probability of short circuit occurring between them is small. Thus, with reference to FIGS. 3 and 6, the first plate C1 has no opening at the connection via 2 corresponding to the second electrode T22 of the driving transistor, but is insulated from and overlapped with the connection via 2 of the second electrode T22 of the driving transistor to increase an area of the first plate C1.

Optionally, as another implementation of the embodiment of the present disclosure, the first plate C1 has an opening C11 at the connection via 2 corresponding to the second electrode T22 of the driving transistor.

Figure 8:
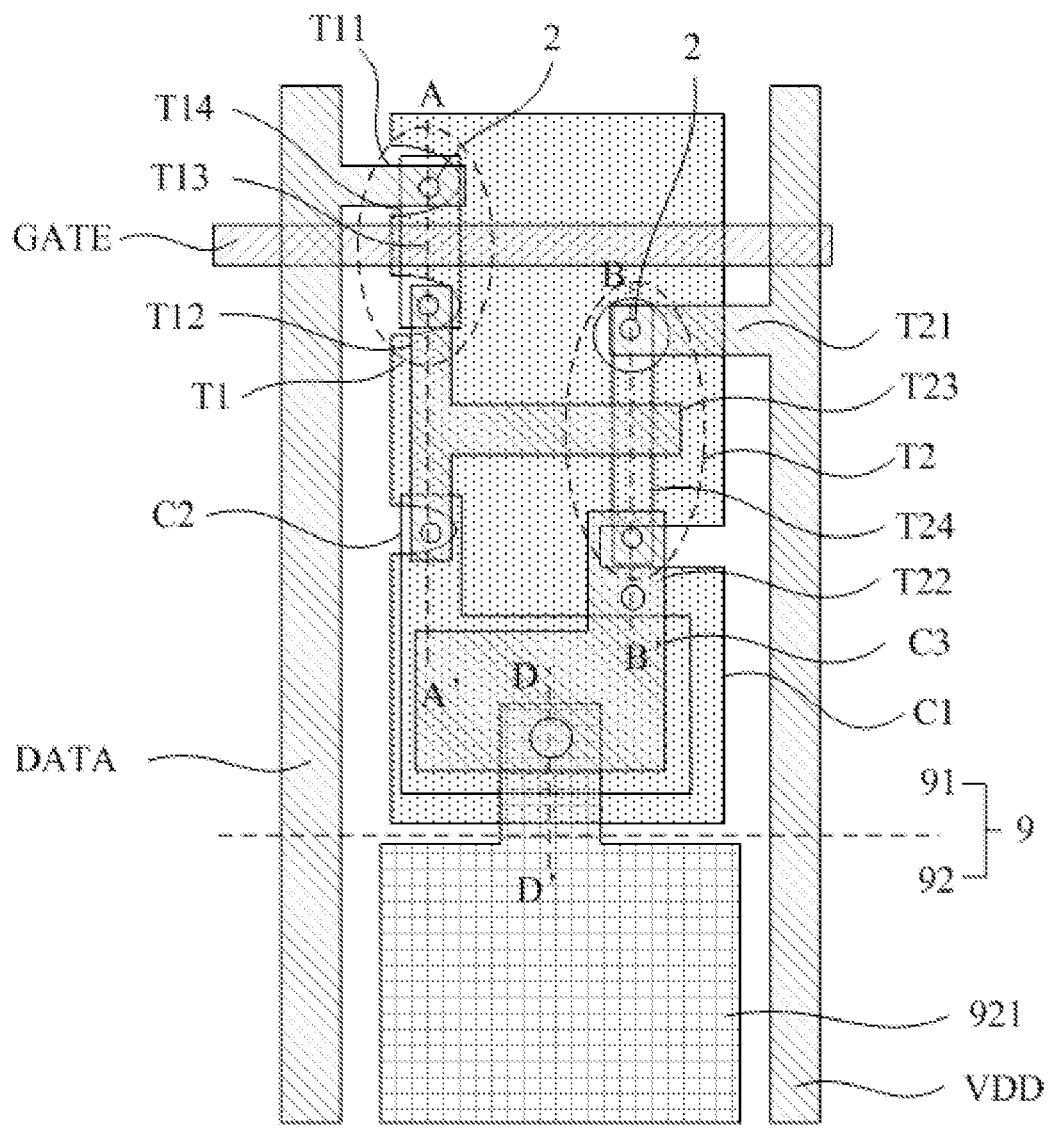
FIG. 8 is a schematic diagram illustrating a structure of a pixel region in a display substrate according to an embodiment of the present disclosure.

That is to say, although the probability of short circuit between the first plate C1 and the second electrode T22 of the driving transistor is relatively small, in order to avoid the short circuit more thoroughly, referring to FIG. 8, the first plate C1 may also have an opening C11 at the connection via 2 corresponding to the second electrode T22 of the driving transistor.

Optionally, the storage capacitor C further includes: a second plate C2 electrically coupled to the second electrode T12 of the switching transistor. The second plate C2 is insulated from and overlapped with the first plate C1 in the direction perpendicular to the display substrate to form a first sub-capacitor.

Referring to FIG. 6, a capacitor is formed only in the case where the first plate C1 overlaps with other plates. According to the above pixel circuit, the first plate C1 may overlap with the second plate C2, and the second plate C2 is electrically coupled to the second electrode T12 of the switching transistor (or the gate T23 of the driving transistor). As shown in FIG. 6, the second plate C2 and the active layer of the pixel transistor are provided in a same layer.

Optionally, the storage capacitor C further includes: a third plate C3 electrically coupled to the first plate C1. The third plate C3 is provided in a different layer from the first plate C1 and in a same layer as the first and second electrodes of the pixel transistor. The third plate C3 is insulated from and overlapped with the second plate C2 to form a second sub-capacitor.

In the embodiment, the third plate C3 may be added, which is provided in a different layer from the first plate C1, and is electrically coupled to the first plate C1, so that the first plate C1 electrically has a same voltage as that of the third plate C3. Meanwhile, referring to FIG. 7, in the direction perpendicular to the display substrate, the third plate C3 and the first plate C1 are respectively located at two sides of the second electrode C2 and overlapped with the second plate C2, so that the capacitance value of the storage capacitor C may be increased without increasing a total area of the storage capacitor C.

Optionally, a boundary angle β of the active layer at the connection via 2 corresponding to the opening C11 is an acute angle.

As shown in FIG. 6, the boundary angle β of the active layer refers to the included angle between a side wall of the active layer and the plane where the base substrate 5 is located.

As shown in FIG. 6, for a same reason, a larger boundary angle β of the active layer is also likely to cause over-etching, increasing the possibility of short circuit between the different conductive layers, so the etching boundary angle β of the active layer (such as the active layer T14 of the switching transistor and the active layer T24 of the driving transistor) at least in the vicinity of the connection via 2 corresponding to the opening C11 is acute angle (of course, the boundary angles β of the same active layer at respective positions are usually the same for the process reason).

Further, the slope angle α of the connection via 2 corresponding to the opening C11 is an acute angle; and satisfies $(α+β)/2 > \min(α,β) > \frac{1}{4}α$. The slope angle α and the boundary angle β are corresponding angles of the same connection via 2 corresponding to the opening C11.

Referring to FIG. 6, at the same connection via 2 corresponding to the opening C11 (e.g., the connection via 2 corresponding to the first electrode T21 of the driving transistor), both the slope angle α of the connection via 2 and the boundary angle β of the active layer (e.g., the active layer T24 of the driving transistor) are acute angles, and satisfy the above formula $(α+β)/2 > \min(α, β) > \frac{1}{4}α$, so that the etching rate may be kept fast, and the requirement is met that the possibility of short circuit between different layers at the position of the connection via 2 may be reduced.

Figure 7:
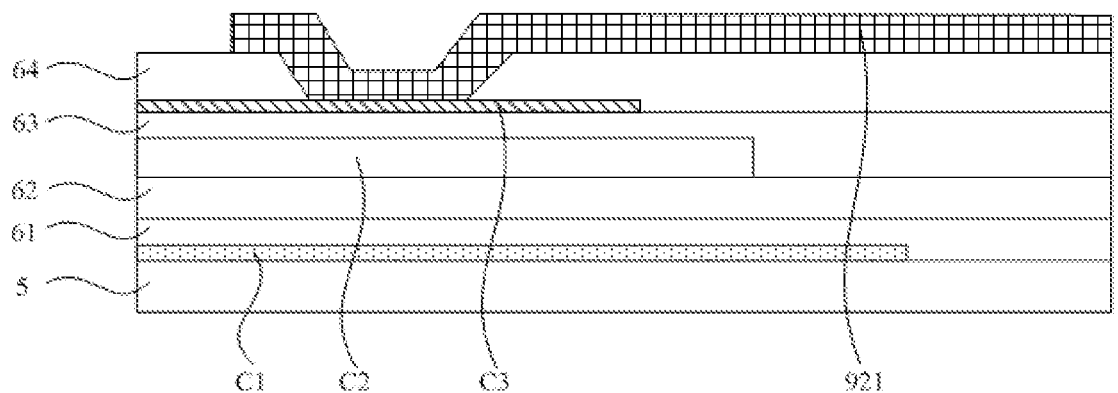
FIG. 7 is a schematic cross-sectional view along a line DD' in FIG. 3.

Of course, it should be understood that, referring to FIGS. 5 to 7, other known structures may be included in the above display substrate, such as, a light emitting layer and the second electrode (not shown in the drawings) of the light emitting element L, a first insulating layer 61 for isolating the gate T13 of the switching transistor from the first plate C1, a second insulating layer 62 for isolating the gate T13 of the switching transistor from the active layer T14 (also including the active layer T24 of the driving transistor), a third insulating layer 63 for isolating the active layers from the first electrodes/the second electrodes, a fourth insulating layer 64 for isolating the first electrodes/the second electrodes from the pixel electrode 921, or the like.

Of course, it should be understood that, referring to FIGS. 5 to 7, some of the different structures in the above display substrate may be provided in a same layer. For example, the gate line GATE may be provided in a same layer as the gate T13 of the switching transistor; the second plate C2 may be provided in a same layer as the active layers (the second plate C2 may be conducted); the third plate C3, the first/second electrodes, the data line DATA, the first power line VDD, or the like, may be provided in a same layer.

Of course, it should be understood that, in the above display substrate, the two structures may be electrically coupled to each other, which may be implemented in different implementations.

In a first implementation, referring to FIGS. 5 to 7, if the two structures are in different layers, the two structures may be electrically coupled to each other through a via. For example, the second electrode T12 of the switching transistor may be electrically coupled to the second plate C2 through a via; and referring to FIG. 3, the first plate C1 may be further provided with an opening C11 at the via. As another example, the third plate C3 may be coupled to the first plate C1 through a via, and the pixel electrode 921 may be coupled to the third plate C3 through a via, so that the first plate C1, the third plate C3, and the pixel electrode 921 may be electrically coupled to each other.

In a second implementation, referring to FIGS. 5 to 7, if the two structures are in a same layer, they may be directly coupled to each other. For example, the second electrode T12 of the switching transistor may be directly coupled to the gate T23 of the driving transistor. As another example, the second electrode T22 of the driving transistor may be directly coupled to the third plate C3, so that the second electrode T22 of the driving transistor, the first plate C1, the third plate C3, and the pixel electrode 921 may be electrically coupled to each other.

Of course, it should be understood that, although a specific pixel circuit (an organic light emitting diode pixel circuit) is described above as an example, the embodiments of the present disclosure are also applicable to other pixel circuits, such as a pixel circuit for a liquid crystal display (LCD), or the like, which will not be described in detail herein.

Referring to FIGS. 1 to 8, according to an aspect of the present disclosure, a method for manufacturing the above display substrate is provided. Each of pixel regions of the display substrate includes a display region provided with a pixel electrode and a driving region provided with a pixel circuit. The pixel circuit includes at least one pixel transistor. First and second electrodes of the pixel transistor are coupled to the active layer thereof through connection vias, respectively. A first plate of a storage capacitor is located in the driving region. The first plate is insulated from and overlapped with the first and second electrodes of the pixel transistor in a direction perpendicular to the display substrate, and the first plate is provided with openings at positions corresponding to at least some of the connection vias.

Figure 9:
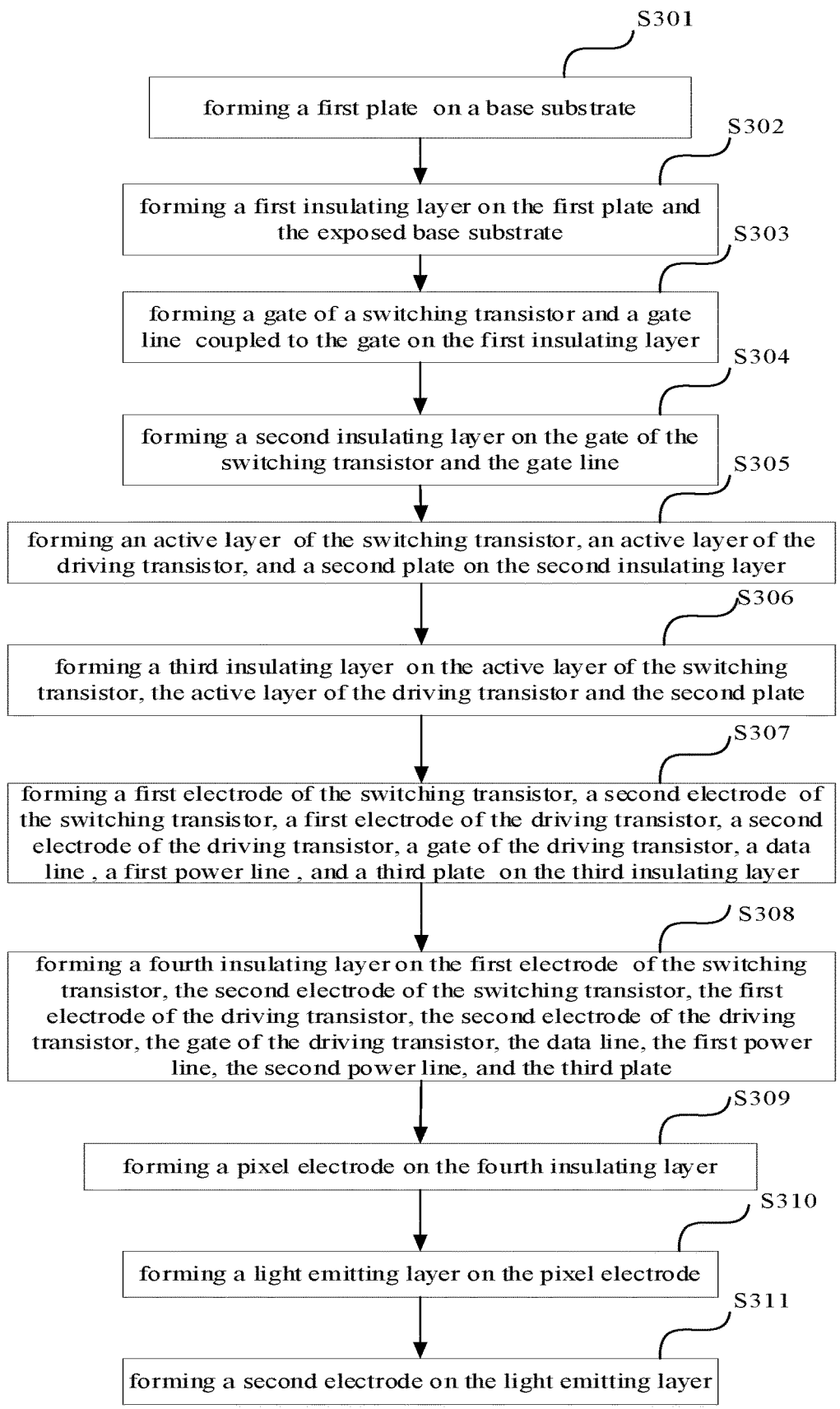
FIG. 9 is a flowchart of a method for manufacturing a display substrate according to an embodiment of the present disclosure.

Specifically, as shown in FIG. 9, the method for manufacturing the display substrate shown in FIG. 3 may include the following steps.

At S301, a first plate C1 is formed on a base substrate by a patterning process. The first plate C1 is insulated from and overlapped with the first and second electrodes of the pixel transistor to be formed in the direction perpendicular to the display substrate, and the first plate is provided with openings at positions corresponding to at least some of the connection vias.

At S302, a first insulating layer 61 is formed on the first plate C1 and the exposed base substrate by a patterning process.

At S303, a gate T13 of a switching transistor and a gate line GATE coupled to the gate T13 are formed on the first insulating layer 61 by a patterning process.

At S304, a second insulating layer 62 is formed on the gate T13 of the switching transistor and the gate line GATE by a patterning process.

At S305, an active layer T14 of the switching transistor, an active layer T24 of a driving transistor, and a second plate C2 are formed on the second insulating layer 62 by a patterning process. The second plate C2 is insulated from and overlapped with the first plate C1 in the direction perpendicular to the base substrate to form a first sub-capacitor. The second plate C2 and the active layer of each of the transistors may be formed by a single process, i.e., the second plate C2 and the active layer of each of the transistors may be formed by using a same material (e.g., polysilicon), and the second plate C2 is ion-doped separately to increase the conductivity thereof.

At S306, a third insulating layer 63 is formed on the active layer T14 of the switching transistor, the active layer T24 of the driving transistor and the second plate C2 by a patterning process.

At S307, a first electrode T11 of the switching transistor, a second electrode T12 of the switching transistor, a first electrode T21 of the driving transistor, a second electrode T22 of the driving transistor, a gate T23 of the driving transistor, a data line DATA, a first power line VDD, and a third plate C3 are formed on the third insulating layer 63 by a patterning process. The third plate C3 is coupled to the first plate C1 through a connection via, and is coupled to the second electrode T22 of the driving transistor. The second plate C2 is insulated from and overlapped with the third plate C3 in the direction perpendicular to the base substrate to form a second sub-capacitor. The second electrode T12 of the switching transistor is coupled to the gate T23 of the driving transistor. The first electrode T11 of the switching transistor is coupled to the data line DATA. The first electrode T21 of the driving transistor is coupled to the first power line VDD.

At S308, a fourth insulating layer 64 is formed on the first electrode T11 of the switching transistor, the second electrode T12 of the switching transistor, the first electrode T21 of the driving transistor, the second electrode T22 of the driving transistor, the gate T23 of the driving transistor, the data line DATA, the first power line VDD, the second power line VSS, and the third plate C3 by a patterning process.

At S309, a pixel electrode 921 (a first electrode) is formed on the fourth insulating layer 64 by a patterning process. The pixel electrode 921 is coupled to the third plate C3 through a connection via.

At S310, a light emitting layer is formed on the pixel electrode 921 by a patterning process.

At S311, a second electrode of the light emitting device is formed on the light emitting layer by a patterning process. The second electrode is coupled to the second power line VSS through a connection via.

The above method is described by taking an example in which the switching transistor is a bottom gate type and the driving transistor is a top gate type, but the disclosure is not limited thereto.

According to an aspect of the present disclosure, a display device including the above display substrate is provided.

Specifically, the display device may be any product or component having a display function, such as a liquid crystal display (LCD) panel, an organic light emitting diode (OLED) display panel, electronic paper, a mobile phone, a tablet computer, a television, a display, a notebook computer, a digital photo frame, a navigator, or the like.

It should be understood that the above embodiments are merely exemplary embodiments employed to illustrate the principles of the present disclosure, but the present disclosure is not limited thereto. It will be apparent to one of ordinary skill in the art that various changes and modifications can be made therein without departing from the spirit and scope of the disclosure, and these changes and modifications are to be considered within the scope of the present disclosure.

What is claimed is:

1. A display substrate, comprising a plurality of pixel regions, each of the pixel regions comprising a display region provided with a light emitting device and a driving region provided with a pixel circuit, the pixel circuit comprising at least one pixel transistor having a first electrode and a second electrode which are coupled to an active layer of the at least one pixel transistor through connection vias, respectively, wherein
   the driving region is further provided with a first plate of a storage capacitor, the first plate is insulated from and overlapped with the first electrode and the second electrode of the at least one pixel transistor in a direction perpendicular to the display substrate, and the first plate is provided with openings at positions corresponding to at least some of the connection vias.

2. The display substrate of claim 1, wherein in one of the pixel regions, the first plate is coupled to a first electrode of the light emitting element, and a second electrode of the light emitting element is coupled to a second power supply line;
   the at least one pixel transistor comprises a switching transistor and a driving transistor; wherein
   a gate of the switching transistor is coupled to a gate line, a first electrode of the switching transistor is coupled to a data line, and a second electrode of the switching transistor is electrically coupled to a gate of the driving transistor; and
   a first electrode of the driving transistor is coupled to a first power line, and a second electrode of the driving transistor is coupled to a pixel electrode.

3. The display substrate of claim 2, wherein the first plate has at least one of the openings at at least one of positions corresponding to the following connection vias:
   a connection via of the first electrode of the switching transistor;
   a connection via of the second electrode of the switching transistor; and
   a connection via of the first electrode of the driving transistor.

4. The display substrate of claim 3, wherein
   the first plate is insulated from and overlapped with the connection via of the second electrode of the driving transistor in the direction perpendicular to the display substrate, and
   the first plate has at least one of the openings at a position corresponding to the connection via corresponding to the second electrode of the driving transistor.

5. The display substrate of claim 3, wherein
   the first plate is insulated from and overlapped with the connection via of the second electrode of the driving transistor in the direction perpendicular to the display substrate, and
   the first plate is not provided with at least one of the openings at a position corresponding to the connection via corresponding to the second electrode of the driving transistor.

6. The display substrate of claim 5, wherein the storage capacitor further comprises:

a second plate electrically coupled to the second electrode of the switching transistor,
wherein the second plate is insulated from and overlapped with the first plate in the direction perpendicular to the display substrate to form a first sub-capacitor.

7. The display substrate of claim 6, wherein the second plate is in a same layer as the active layer of the pixel transistor.

8. The display substrate of claim 7, wherein the storage capacitor further comprises: a third plate electrically coupled to the first plate, and
the third plate is in a same layer with the first electrode and the second electrode of the pixel transistor, and is insulated from and overlapped with the second plate to form a second sub-capacitor.

9. The display substrate of claim 2, wherein
the light emitting element is an organic light emitting diode.

10. The display substrate of claim 9, further comprising a base substrate, wherein
the first electrode and the second electrode of the pixel transistor are on a side of the active layer of the pixel transistor distal to the base substrate; and
the first plate is on a side of the active layer of the pixel transistor proximal to the base substrate.

11. The display substrate of claim 10, wherein
an orthographic projection of at least one of the openings on the base substrate covers an orthographic projection of the corresponding connection via on the base substrate.

12. The display substrate of claim 11, wherein
the orthographic projection of at least one of the openings on the base substrate has an area larger than or equal to an area of the orthographic projection of the corresponding connection via on the base substrate.

13. The display substrate of claim 12, wherein
a slope angle of the connection via corresponding to at least one of the openings is an acute angle, and the slope angle is an included angle between a side wall of the connection via and a plane where the display substrate is located.

14. The display substrate of claim 13, wherein
the slope angle of the connection via corresponding to at least one of the openings is in a range from 45 degrees to 75 degrees.

15. The display substrate of claim 14, wherein
a boundary angle of the active layer at the connection via corresponding to at least one of the openings is an acute angle, and the boundary angle is an included angle between a side wall of the active layer and a plane where the display substrate is located.

16. The display substrate of claim 12, wherein
a slope angle of the connection via corresponding to at least one of the openings is an acute angle; and
$(\alpha+\beta)/2 > \min(\alpha, \beta) > \frac{1}{4}\alpha$, wherein $\alpha$ is a slope angle of any connection via corresponding to at least one of the openings, $\beta$ is a boundary angle of the active layer at the connection via, the slope angle is an included angle between a side wall of the connection via and a plane where the display substrate is located, and the boundary angle is an included angle between a side wall of the active layer and the plane where the display substrate is located.

17. The display substrate of claim 16, wherein at least one of the openings comprises:
a notch at an edge of the first plate;
and/or
a through hole within the first plate.

18. A display device, comprising:
the display substrate of claim 1.

19. A method for manufacturing a display substrate, comprising:
providing a base substrate;
forming a storage capacitor and at least one pixel transistor on the base substrate, wherein
the display substrate comprises a plurality of pixel regions, each of the pixel regions comprises a display region provided with a pixel electrode and a driving region provided with a pixel circuit, the pixel circuit comprises at least one pixel transistor having a first electrode and a second electrode which are coupled to an active layer of the at least one pixel transistor through connection vias, respectively, wherein
a first plate of the storage capacitor is located in the driving region, the first plate is insulated from and overlapped with the first electrode and the second electrode of the pixel transistor in a direction perpendicular to the display substrate, and the first plate is provided with openings at positions corresponding to at least some of the connection vias.

20. The method of claim 19, wherein the forming a storage capacitor and at least one pixel transistor on the base substrate comprises:
forming the first plate of the storage capacitor on the base substrate;
forming a first insulating layer on the first plate;
forming a gate of a switching transistor and a gate line on the first insulating layer;
forming a second insulating layer on the gate of the switching transistor and the gate line;
forming an active layer of the switching transistor, an active layer of a driving transistor and a second plate of the storage capacitor on the second insulating layer, wherein the second plate is insulated from and overlapped with the first plate in a direction perpendicular to the base substrate to form a first sub-capacitor;
forming a third insulating layer on the active layer of the switching transistor, the active layer of the driving transistor, and the second plate of the storage capacitor; and
forming a first electrode of the switching transistor, a second electrode of the switching transistor, a first electrode of the driving transistor, a second electrode of the driving transistor, a gate of the driving transistor, a data line, a first power supply line and a third plate on the third insulating layer, wherein the third plate is coupled to the first plate through the connection via and is coupled to the second electrode of the driving transistor, and the second plate is insulated from and overlapped with the third plate in the direction perpendicular to the base substrate to form a second sub-capacitor.

* * * * *